(12) United States Patent
Kumar et al.

(10) Patent No.: US 11,264,460 B2
(45) Date of Patent: Mar. 1, 2022

(54) VERTICAL TRANSISTOR FABRICATION FOR MEMORY APPLICATIONS

(71) Applicant: Applied Materials, Inc., Santa Clara, CA (US)

(72) Inventors: Arvind Kumar, Santa Clara, CA (US); Sanjeev Manhas, Uttarakhand (IN); Mahendra Pakala, Santa Clara, CA (US); Ellie Y. Yieh, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 55 days.

(21) Appl. No.: 16/519,246

(22) Filed: Jul. 23, 2019

(65) Prior Publication Data

US 2021/0028282 A1 Jan. 28, 2021

(51) Int. Cl.
| | |
|---|---|
| *H01L 29/10* | (2006.01) |
| *H01L 29/78* | (2006.01) |
| *H01L 21/8234* | (2006.01) |
| *H01L 29/04* | (2006.01) |
| H01L 27/11556 | (2017.01) |
| H01L 27/11582 | (2017.01) |

(52) U.S. Cl.
CPC .... *H01L 29/105* (2013.01); *H01L 21/823412* (2013.01); *H01L 29/04* (2013.01); *H01L 29/7827* (2013.01); *H01L 27/11556* (2013.01); *H01L 27/11582* (2013.01)

(58) Field of Classification Search
CPC ... H01L 29/1041–1054; H01L 29/7827; H01L 29/04; H01L 27/11524–11556; H01L 27/11582; H01L 21/823412

USPC .......................................................... 257/66
See application file for complete search history.

(56) References Cited

U.S. PATENT DOCUMENTS

| | | | |
|---|---|---|---|
| 6,964,928 | B2 | 11/2005 | Ying et al. |
| 7,750,421 | B2 | 7/2010 | Horng et al. |
| 9,028,910 | B2 | 5/2015 | Zhou et al. |
| 2004/0101978 | A1 | 5/2004 | Linn et al. |
| 2012/0140562 | A1 | 6/2012 | Choe et al. |
| 2015/0017772 | A1 | 1/2015 | Waite et al. |
| 2015/0255507 | A1 | 9/2015 | Pakala et al. |

(Continued)

OTHER PUBLICATIONS

Kim K. T., An, S. W., Jung, S. J., Yoo, K., & Kim, T. W. The effects of taper-angle on the electrical characteristics of vertical NAND flash memories. IEEE Electron Device Lett., 38, 10, 1375-1378 (2017). (Year: 2017).*

(Continued)

*Primary Examiner* — Lex H Malsawma
*Assistant Examiner* — Gardner W. S. Swan
(74) *Attorney, Agent, or Firm* — Patterson + Sheridan, LLP (57) ABSTRACT

The present disclosure provides methods for forming a channel structure in a film stack for manufacturing three dimensional (3D) stacked memory cell semiconductor devices. In one embodiment, a memory cell device includes a film stack comprising alternating pairs of dielectric layers and conductive structures horizontally formed on a substrate, and a channel structure formed in the film stack, wherein the channel structure is filled with a channel layer and a protective blocking layer, wherein the channel layer has a gradient dopant concentration along a vertical stacking of the film stack.

7 Claims, 8 Drawing Sheets

(56) References Cited

U.S. PATENT DOCUMENTS

| | | | |
|---|---|---|---|
| 2015/0270280 A1* | 9/2015 | Simsek-Ege | H01L 21/02595 |
| | | | 257/66 |
| 2016/0099250 A1 | 4/2016 | Rabkin et al. | |
| 2016/0351799 A1 | 12/2016 | Xue et al. | |
| 2018/0033794 A1 | 2/2018 | Baraskar et al. | |
| 2018/0233513 A1* | 8/2018 | Zhang | G11C 16/08 |
| 2018/0294279 A1 | 10/2018 | Sawabe et al. | |
| 2020/0111807 A1* | 4/2020 | Xu | H01L 27/11582 |

OTHER PUBLICATIONS

Oh, Y. T., et al. Impact of etch angles on cell characteristics in 3D NAND flash memory. Microelectronics J., 79, 1-6 (2018). (Year: 2018).*

International Search Report and Written Opinion for International Application No. PCT/US2020/038168 dated Sep. Oct. 7, 2020.

* cited by examiner

VERTICAL TRANSISTOR FABRICATION FOR MEMORY APPLICATIONS

BACKGROUND

Field

Embodiments of the present disclosure generally relate to methods of manufacturing a vertical type memory cell semiconductor device, and more particularly to methods of manufacturing a vertical type memory cell semiconductor device with desired device performance for semiconductor manufacturing applications.

Description of the Related Art

Reliably producing sub-half micron and smaller features is one of the key technology challenges for next generation very large scale integration (VLSI) and ultra large-scale integration (ULSI) of semiconductor devices. However, as the limits of circuit technology are pushed, the shrinking dimensions of VLSI and ULSI interconnect technology have placed additional demands on processing capabilities. Reliable formation of gate structures on the substrate is important to VLSI and ULSI success and to the continued effort to increase circuit density and quality of individual substrates and die.

In order to enable fabrication of next generation devices and structures, three dimensional (3D) stacking of semiconductor memory chips is often utilized to improve performance of the transistors. By arranging transistors in three dimensions instead of conventional two dimensions, multiple transistors may be placed in the integrated circuits (ICs) very close to each other. Three dimensional (3D) stacking of semiconductor chips reduces wire lengths and keeps wiring delay low. When forming flash memory structures, a film stack is disposed on a substrate and an etching process is performed to etch a trench in the film stack. The trench is later utilized as a channel structure to electrically communicate between a source and a drain structure formed nearby. The film stack typically includes repeatedly alternating layers of layers, either conductive layers or insulating layers. Due to the requirement of the high number of the repeatedly alternating layers in the film stack for higher device performance, the channel structures formed in the film stack often have high aspect ratios. Etching through the film stack with different materials therein often results in profile deformation and/or tapering structures of the channel structure. Inconsistent width of the channel structure often results in threshold voltage and cell current drift along the vertical three dimensional (3D) stacking of the memory device.

Thus, there is a need for improved methods for forming channel structures for three dimensional (3D) stacking of semiconductor devices with controlled electrical performance and properties.

SUMMARY

The present disclosure provides methods for forming a channel structure in a film stack for manufacturing three dimensional (3D) stacked memory cell semiconductor devices. In one embodiment, a memory cell device includes a film stack comprising alternating pairs of dielectric layers and conductive structures horizontally formed on a substrate, and a channel structure formed in the film stack, wherein the channel structure is filled with a channel layer and a protective blocking layer, wherein the channel layer has a gradient dopant concentration along a vertical stacking of the film stack.

In another embodiment, a memory cell device includes a film stack comprising alternating pairs of dielectric layers and conductive structures horizontally formed on a substrate, and a channel structure formed in the film stack, wherein the channel structure is filled with a channel layer and a protective blocking layer, wherein the protective blocking layer has an non-uniform thickness along a vertical stacking of the film stack.

In yet another embodiment, a method of memory device on a substrate includes forming a channel structure in a film stack by filling the channel structure with a channel layer and a protective blocking layer, wherein the channel layer has a gradient dopant concentration along a vertical stacking of the film stack.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this disclosure and are therefore not to be considered limiting of its scope, for the disclosure may admit to other equally effective embodiments.

DETAILED DESCRIPTION

The present disclosure provides methods for forming a channel structure in a film stack for manufacturing three dimensional (3D) stacked memory cell semiconductor devices. In one embodiment, a memory cell device includes a film stack comprising alternating pairs of dielectric layers and conductive structures horizontally formed on a substrate, a channel structure is formed in the film stack, and the channel structure is filled with a channel layer and a protective liner layer. The channel layer formed in the channel structure may be a silicon material with different doping concentration along the vertical three dimensional (3D) stacking of the memory device. As the width of the channel structure is varied (e.g., the slope of the channel structure varied), the dopant concentration of the channel layer formed in the channel structure may be varied as well. In one example, the channel layer may be a polysilicon material, epitaxial silicon or alternate channel materials, such as IGZO, or other combination of III-V compounds. Furthermore, the protective blocking layer formed along the sidewall of the channel structure may have gradient and/or varied thickness along the channel structure so as to compensate the change of the width and/or slope of the channel structure. Different dopant materials or dopant concentrations of the channel layer may be adjusted based on different slope or profile of the channel structure formed in the vertical three dimensional (3D) stacking of the memory device.

Figure 1:
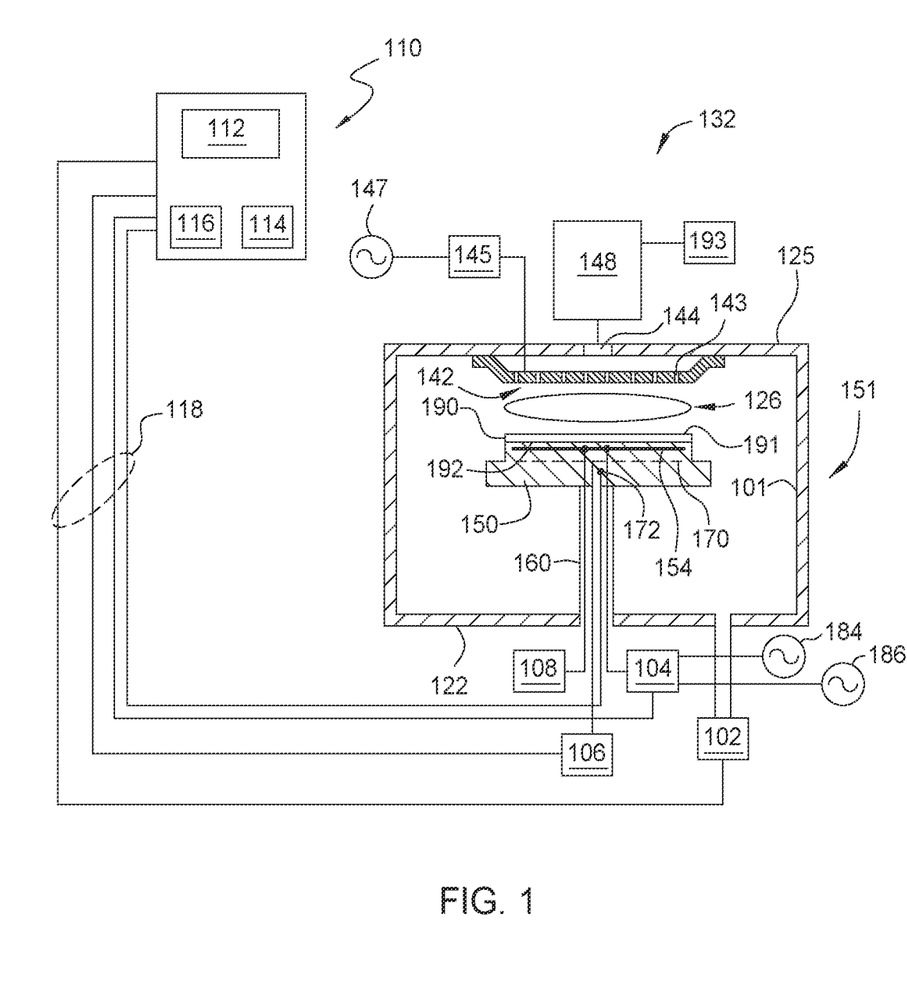
FIG. 1 depicts an apparatus utilized to form a channel structure on a substrate in accordance with one embodiment of the present disclosure.

FIG. 1 is a cross sectional view of a plasma processing chamber 132 suitable for performing a plasma deposition process (e.g., a plasma enhanced CVD or a metal organic CVD) that may be utilized as semiconductor interconnection structures for semiconductor devices manufacture. The processing chamber 132 may be a suitably adapted CENTURA®, PRODUCER® SE or PRODUCER® GT or PRODUCER® XP processing system available from Applied Materials, Inc., of Santa Clara, Calif. It is contemplated that other processing systems, including those produced by other manufacturers, may benefit from embodiments described herein.

The processing chamber 132 includes a chamber body 151. The chamber body 151 includes a lid 125, a sidewall 101 and a bottom wall 122 that define an interior volume 126.

A substrate support pedestal 150 is provided in the interior volume 126 of the chamber body 151. The pedestal 150 may be fabricated from aluminum, ceramic, aluminum nitride, and other suitable materials. In one embodiment, the pedestal 150 is fabricated by a ceramic material, such as aluminum nitride, which is a material suitable for use in a high temperature environment, such as a plasma process environment, without causing thermal damage to the pedestal 150. The pedestal 150 may be moved in a vertical direction inside the chamber body 151 using a lift mechanism (not shown).

The pedestal 150 may include an embedded heater element 170 suitable for controlling the temperature of a substrate 190 supported on the pedestal 150. In one embodiment, the pedestal 150 may be resistively heated by applying an electric current from a power supply 106 to the heater element 170. In one embodiment, the heater element 170 may be made of a nickel-chromium wire encapsulated in a nickel-iron-chromium alloy (e.g., INCOLOY®) sheath tube. The electric current supplied from the power supply 106 is regulated by the controller 110 to control the heat generated by the heater element 170, thus maintaining the substrate 190 and the pedestal 150 at a substantially constant temperature during film deposition at any suitable temperature range. In another embodiment, the pedestal may be maintained at room temperature as needed. In yet another embodiment, the pedestal 150 may also include a chiller (not shown) as needed to cool the pedestal 150 at a range lower than room temperature as needed. The supplied electric current may be adjusted to selectively control the temperature of the pedestal 150 between about 100 degrees Celsius to about 700 degrees Celsius.

A temperature sensor 172, such as a thermocouple, may be embedded in the substrate support pedestal 150 to monitor the temperature of the pedestal 150 in a conventional manner. The measured temperature is used by the controller 110 to control the power supplied to the heater element 170 to maintain the substrate at a desired temperature.

The pedestal 150 generally includes a plurality of lift pins (not shown) disposed therethrough that are configured to lift the substrate 190 from the pedestal 150 and facilitate exchange of the substrate 190 with a robot (not shown) in a conventional manner.

The pedestal 150 comprises at least one electrode 192 for retaining the substrate 190 on the pedestal 150. The electrode 192 is driven by a chucking power source 108 to develop an electrostatic force that holds the substrate 190 to the pedestal surface, as is conventionally known. Alternatively, the substrate 190 may be retained to the pedestal 150 by clamping, vacuum or gravity.

In one embodiment, the pedestal 150 is configured as a cathode having the electrode 192 embedded therein coupled to at least one RF bias power source, shown in FIG. 1 as two RF bias power sources 184, 186. Although the example depicted in FIG. 1 shows two RF bias power sources 184, 186, it is noted that the number of the RF bias power sources may be any number as needed. The RF bias power sources 184, 186 are coupled between the electrode 192 disposed in the pedestal 150 and another electrode, such as a gas distribution plate 142 or lid 125 of the processing chamber 132. The RF bias power source 184, 186 excites and sustains a plasma discharge formed from the gases disposed in the processing region of the processing chamber 132.

In the embodiment depicted in FIG. 1, the dual RF bias power sources 184, 186 are coupled to the electrode 192 disposed in the pedestal 150 through a matching circuit 104. The signal generated by the RF bias power source 184, 186 is delivered through matching circuit 104 to the pedestal 150 through a single feed to ionize the gas mixture provided in the plasma processing chamber 132, thereby providing ion energy necessary for performing a deposition or other plasma enhanced process. The RF bias power sources 184, 186 are generally capable of producing an RF signal having a frequency of from about 50 kHz to about 200 MHz and a power between about 0 Watts and about 5000 Watts.

A vacuum pump 102 is coupled to a port formed in the bottom 122 of the chamber body 151. The vacuum pump 102 is used to maintain a desired gas pressure in the chamber body 151. The vacuum pump 102 also evacuates post-processing gases and by-products of the process from the chamber body 151.

The processing chamber 132 includes one or more gas delivery passages 144 coupled through the lid 125 of the processing chamber 132. The gas delivery passages 144 and the vacuum pump 102 are positioned at opposite ends of the processing chamber 132 to induce laminar flow within the interior volume 126 to minimize particulate contamination.

The gas delivery passage 144 is coupled to the gas panel 193 through a remote plasma source (RPS) 148 to provide a gas mixture into the interior volume 126. In one embodiment, the gas mixture supplied through the gas delivery passage 144 may be further delivered through a gas distribution plate 142 disposed below the gas delivery passage 144. In one example, the gas distribution plate 142 having a plurality of apertures 143 is coupled to the lid 125 of the chamber body 151 above the pedestal 150. The apertures 143 of the gas distribution plate 142 are utilized to introduce process gases from the gas panel 193 into the chamber body 151. The apertures 143 may have different sizes, number, distributions, shape, design, and diameters to facilitate the flow of the various process gases for different process requirements. A plasma is formed from the process gas mixture exiting the gas distribution plate 142 to enhance thermal decomposition of the process gases resulting in the deposition of material on the surface 191 of the substrate 190.

The gas distribution plate 142 and substrate support pedestal 150 may be formed a pair of spaced apart electrodes in the interior volume 126. One or more RF sources 147 provide a bias potential through a matching network 145 to the gas distribution plate 142 to facilitate generation of a plasma between the gas distribution plate 142 and the pedestal 150. Alternatively, the RF sources 147 and matching network 145 may be coupled to the gas distribution plate 142, substrate support pedestal 150, or coupled to both the gas distribution plate 142 and the substrate support pedestal 150, or coupled to an antenna (not shown) disposed exterior to the chamber body 151. In one embodiment, the RF sources 147 may provide between about 10 Watts and about 3000 Watts at a frequency of about 30 kHz to about 13.6 MHz. Alternatively, the RF source 147 may be a microwave generator that provide microwave power to the gas distribution plate 142 that assists generation of the plasma in the interior volume 126.

Examples of gases that may be supplied from the gas panel 193 may include a silicon containing gas, fluorine continuing gas, oxygen containing gas, hydrogen containing gas inert gas and carrier gases. Suitable examples of the reacting gases includes a silicon containing gas, such as $SiH_4$, $Si_2H_6$, $SiF_4$, $SiH_2Cl_2$, $Si_4H_{10}$, $Si_5H_{12}$, TEOS and the like. Suitable carrier gas includes nitrogen ($N_2$), argon (Ar), hydrogen ($H_2$), alkanes, alkenes, helium (He), oxygen ($O_2$), ozone ($O_3$), water vapor ($H_2O$), and the like.

In one embodiment, the remote plasma source (RPS) 148 may be alternatively coupled to the gas delivery passages 144 to assist in forming a plasma from the gases supplied from the gas panel 193 into the in the interior volume 126. The remote plasma source 148 provides plasma formed from the gas mixture provided by the gas panel 193 to the processing chamber 132.

The controller 110 includes a central processing unit (CPU) 112, a memory 116, and a support circuit 114 utilized to control the process sequence and regulate the gas flows from the gas panel 193. The CPU 112 may be of any form of a general purpose computer processor that may be used in an industrial setting. The software routines can be stored in the memory 116, such as random access memory, read only memory, floppy, or hard disk drive, or other form of digital storage. The support circuit 114 is conventionally coupled to the CPU 112 and may include cache, clock circuits, input/output systems, power supplies, and the like. Bi-directional communications between the controller 110 and the various components of the processing chamber 132 are handled through numerous signal cables collectively referred to as signal buses 118, some of which are illustrated in FIG. 1.

Figure 2:
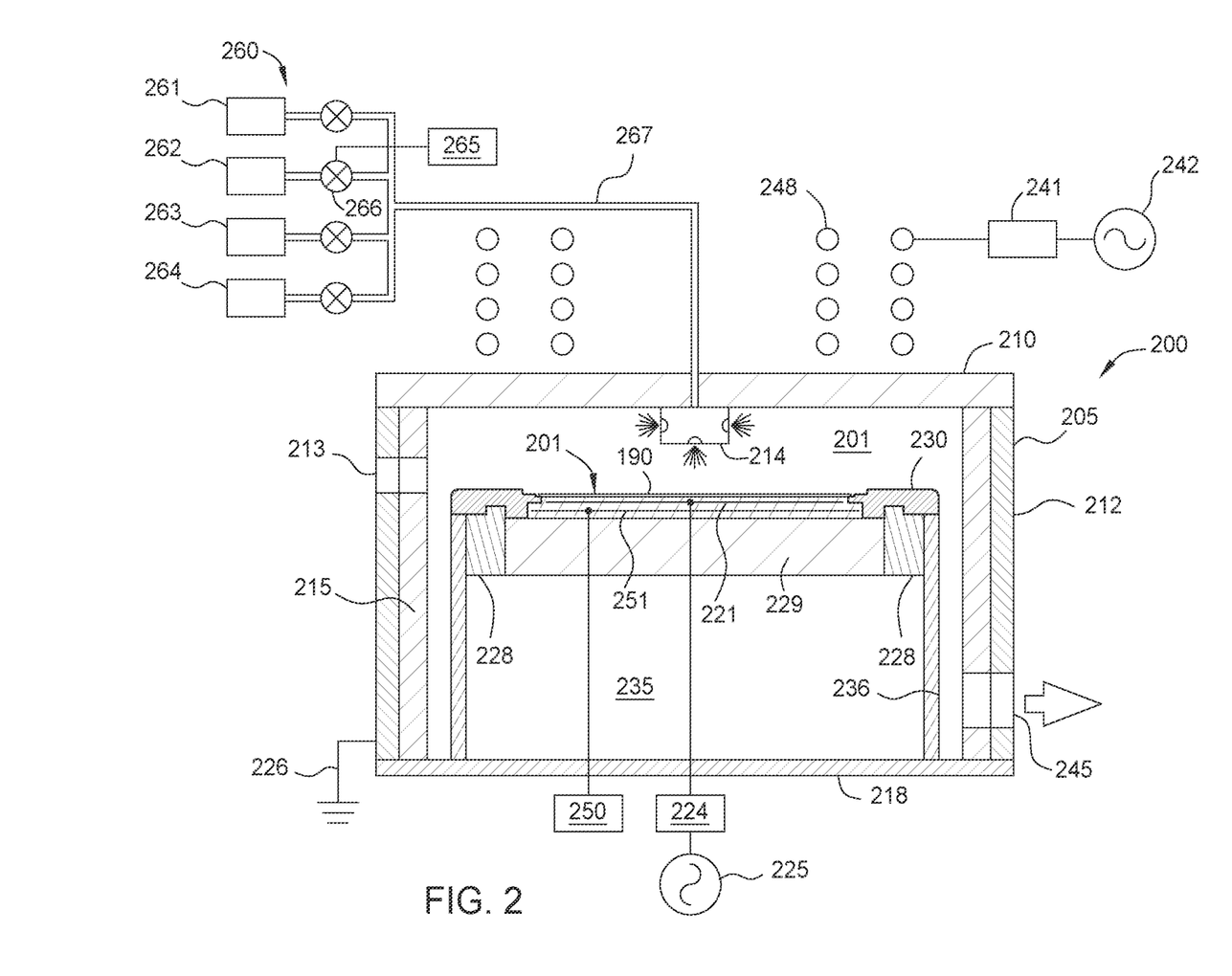
FIG. 2 depicts an apparatus utilized to form channel structure on a substrate in accordance with one embodiment of the present disclosure.

FIG. 2 is a simplified cutaway view for an exemplary processing chamber 200 for etching a metal layer. The exemplary processing chamber 200 is suitable for removing one or more film layers from the substrate 190. One example of the process chamber that may be adapted to benefit from the invention is an AdvantEdge Mesa Etch processing chamber, available from Applied Materials, Inc., located in Santa Clara, Calif. It is contemplated that other process chambers, including those from other manufactures, may be adapted to practice embodiments of the invention.

The processing chamber 200 includes a chamber body 205 having a chamber volume 201 defined therein. The chamber body 205 has sidewalls 212 and a bottom 218 which are coupled to ground 226. The sidewalls 212 have a liner 215 to protect the sidewalls 212 and extend the time between maintenance cycles of the processing chamber 200. The dimensions of the chamber body 205 and related components of the processing chamber 200 are not limited and generally are proportionally larger than the size of the substrate 190 to be processed therein. Examples of substrate sizes include 200 mm diameter, 250 mm diameter, 300 mm diameter and 450 mm diameter, among others.

The chamber body 205 supports a chamber lid assembly 210 to enclose the chamber volume 201. The chamber body 205 may be fabricated from aluminum or other suitable materials. A substrate access port 213 is formed through the sidewall 212 of the chamber body 205, facilitating the transfer of the substrate 190 into and out of the processing chamber 200. The access port 213 may be coupled to a transfer chamber and/or other chambers of a substrate processing system (not shown).

A pumping port 245 is formed through the sidewall 212 of the chamber body 205 and connected to the chamber volume 201. A pumping device (not shown) is coupled through the pumping port 245 to the chamber volume 201 to evacuate and control the pressure therein. The pumping device may include one or more pumps and throttle valves.

A gas panel 260 is coupled by a gas line 267 to the chamber body 205 to supply process gases into the chamber volume 201. The gas panel 260 may include one or more process gas sources 261, 262, 263, 264 and may additionally include inert gases, non-reactive gases, and reactive gases, if desired. Examples of process gases that may be provided by the gas panel 260 include, but are not limited to, hydrocarbon containing gas including methane ($CH_4$), sulfur hexafluoride ($SF_6$), carbon tetrafluoride ($CF_4$), hydrogen bromide (HBr), hydrocarbon containing gas, argon gas (Ar), chlorine ($Cl_2$), nitrogen ($N_2$), and oxygen gas ($O_2$). Additionally, process gasses may include chlorine, fluorine, oxygen and hydrogen containing gases such as $BCl_3$, $C_4F_8$, $O_4F_6$, $CHF_3$, $CH_2F_2$, $CH_3F$, $NF_3$, $CO_2$, $SO_2$, CO, and $H_2$ among others.

Valves 266 control the flow of the process gases from the sources 261, 262, 263, 264 from the gas panel 260 and are managed by a controller 265. The flow of the gases supplied to the chamber body 205 from the gas panel 260 may include combinations of the gases.

The lid assembly 210 may include a nozzle 214. The nozzle 214 has one or more ports for introducing the process gases from the sources 261, 262, 264, 263 of the gas panel 260 into the chamber volume 201. After the process gases are introduced into the processing chamber 200, the gases are energized to form plasma. An antenna 248, such as one or more inductor coils, may be provided adjacent to the processing chamber 200. An antenna power supply 242 may power the antenna 248 through a match circuit 241 to inductively couple energy, such as RF energy, to the process gas to maintain a plasma formed from the process gas in the chamber volume 201 of the processing chamber 300. Alternatively, or in addition to the antenna power supply 242, process electrodes below the substrate 190 and/or above the substrate 190 may be used to capacitively couple RF power to the process gases to maintain the plasma within the chamber volume 201. The operation of the antenna power supply 242 may be controlled by a controller, such as the controller 265, which also controls the operation of other components in the processing chamber 200.

A substrate support pedestal 235 is disposed in the chamber volume 201 to support the substrate 190 during processing. The substrate support pedestal 235 may include an electro-static chuck 222 for holding the substrate 190 during processing. The electro-static chuck (ESC) 222 uses the electro-static attraction to hold the substrate 190 to the substrate support pedestal 235. The ESC 222 is powered by an RF power supply 225 integrated with a match circuit 224. The ESC 222 comprises an electrode 221 embedded within a dielectric body. The RF power supply 225 may provide a RF chucking voltage of about 200 volts to about 2000 volts to the electrode 221. The RF power supply 225 may also include a system controller for controlling the operation of the electrode 221 by directing a DC current to the electrode 221 for chucking and de-chucking the substrate 190.

The ESC 222 may also include an electrode 251 deposed therein. The electrode 251 is coupled to a power source 250 and provides a bias which attracts plasma ions, formed by the process gases in the chamber volume 201, to the ESC 222 and substrate 190 positioned thereon. The power source 250 may cycle on and off, or pulse, during processing of the substrate 190. The ESC 222 has an isolator 228 for the purpose of making the sidewall of the ESC 222 less attractive to the plasma to prolong the maintenance life cycle of the ESC 222. Additionally, the substrate support pedestal 235 may have a cathode liner 236 to protect the sidewalls of the substrate support pedestal 235 from the plasma gases and to extend the time between maintenance of the processing chamber 200.

The ESC 222 may include heaters disposed therein and connected to a power source (not shown), for heating the substrate, while a cooling base 229 supporting the ESC 222 may include conduits for circulating a heat transfer fluid to maintain a temperature of the ESC 222 and the substrate 190 disposed thereon. The ESC 222 is configured to perform in the temperature range required by the thermal budget of the device being fabricated on the substrate 190. For example, the ESC 222 may be configured to maintain the substrate 190 at a temperature of about minus about 25 degrees Celsius to about 500 degrees Celsius for certain embodiments.

The cooling base 229 is provided to assist in controlling the temperature of the substrate 190. To mitigate process drift and time, the temperature of the substrate 190 may be maintained substantially constant by the cooling base 229 throughout the time the substrate 190 is in the processing chamber 200. In one embodiment, the temperature of the substrate 190 is maintained throughout subsequent etch processes at about 70 to 90 degrees Celsius.

A cover ring 230 is disposed on the ESC 222 and along the periphery of the substrate support pedestal 235. The cover ring 230 is configured to confine etching gases to a desired portion of the exposed top surface of the substrate 190, while shielding the top surface of the substrate support pedestal 235 from the plasma environment inside the processing chamber 200. Lift pins (not shown) are selectively moved through the substrate support pedestal 235 to lift the substrate 190 above the substrate support pedestal 235 to facilitate access to the substrate 190 by a transfer robot (not shown) or other suitable transfer mechanism.

The controller 265 may be utilized to control the process sequence, regulating the gas flows from the gas panel 260 into the processing chamber 200 and other process parameters. Software routines, when executed by the CPU, transform the CPU into a specific purpose computer (controller) that controls the processing chamber 200 such that the processes are performed in accordance with the present invention. The software routines may also be stored and/or executed by a second controller (not shown) that is collocated with the processing chamber 200.

The substrate 190 has various film layers disposed thereon which may include at least one metal layer. The various film layers may require etch recipes which are unique for the different compositions of the other film layers in the substrate 190. Multilevel interconnects that lie at the heart of the VLSI and ULSI technology may require the fabrication of high aspect ratio features, such as vias and other interconnects. Constructing the multilevel interconnects may require one or more etch recipes to form patterns in the various film layers. These recipes may be performed in a single etch processing chamber or across several etch processing chambers. Each etch processing chamber may be configured to etch with one or more of the etch recipes. In one embodiment, processing chamber 200 is configured to at least etch a metal layer to form a conductive structure. For processing parameters provided herein, the processing chamber 200 is configured to process a 300 diameter substrate, i.e., a substrate having a plan area of about 0.0707 m$^2$. The process parameters, such as flow and power, may generally be scaled proportionally with the change in the chamber volume or substrate plan area.

Figure 3:
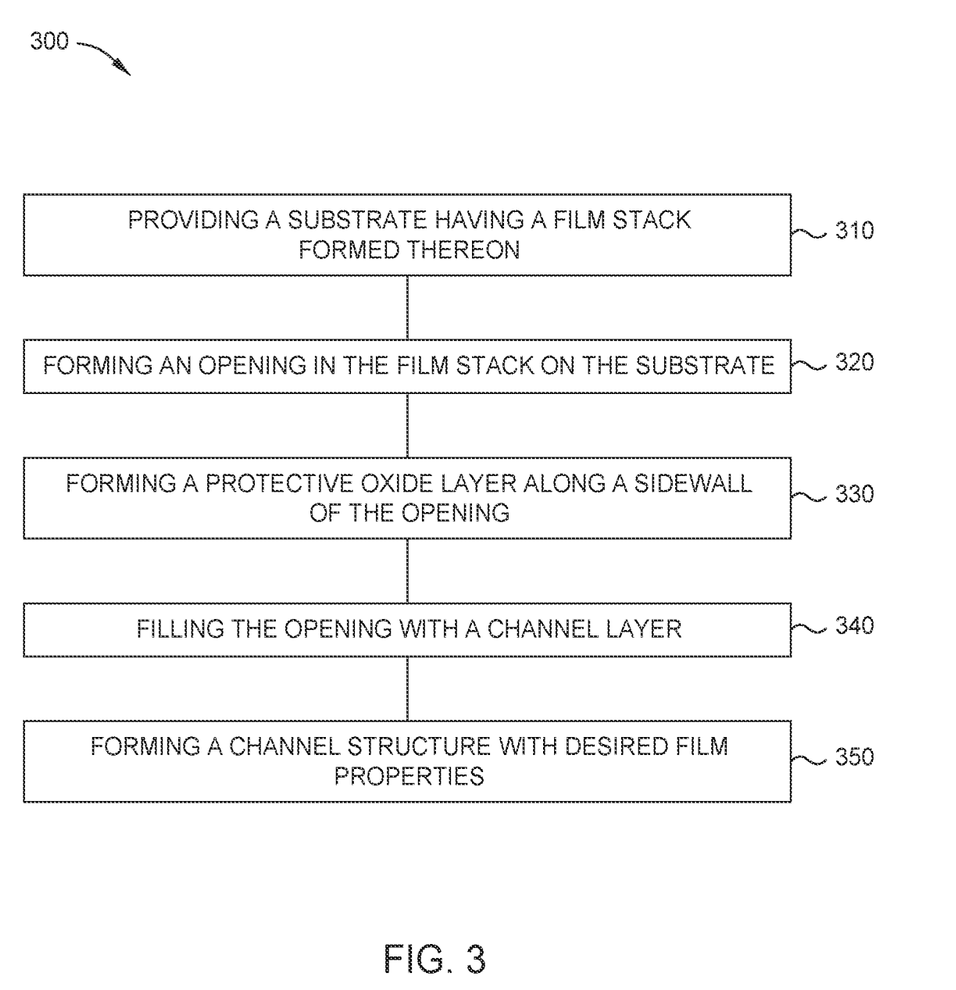
FIG. 3 depicts a flow diagram of a method for memory cell structures formed on a substrate in accordance with one embodiment of the present disclosure.

FIG. 3 is a flow diagram of one embodiment of a method 300 for forming memory cell structures in a film stack disposed on a substrate that may be performed in a processing chamber, such as the processing chamber 132 depicted in FIG. 1 and the processing chamber 200 depicted in FIG. 2. FIGS. 4A-4D are schematic cross-sectional views illustrating a sequence for forming memory cell structures in a film stack disposed on a substrate according to the method 300. Although the method 300 is described below with reference to a substrate utilized to manufacture memory cell structures in a film stack for three dimensional semiconductor devices, the method 300 may also be used to advantage in other device manufacturing applications.

Figure 4A:
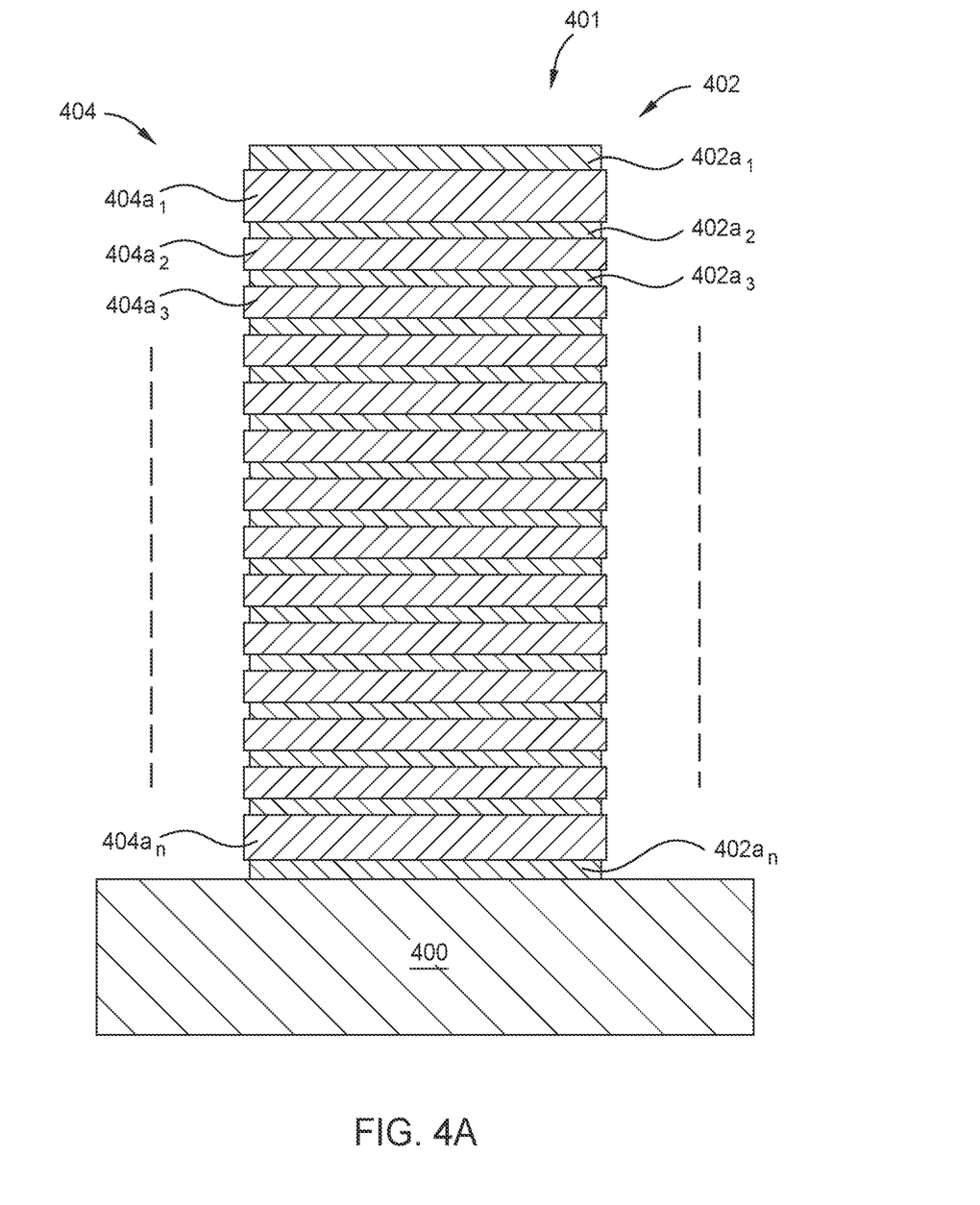
FIGS. 4A-4D depict a sequence for manufacturing memory cell structures formed on a substrate in accordance with the embodiment depicted in FIG. 3.

The method 300 begins at operation 310 by providing a substrate, such as a substrate 400 having a film stack 401 formed thereon, as shown in FIG. 4A. The substrate 400 may be a silicon based material or any suitable insulating materials or conductive materials as needed, having a film stack 401 disposed on the substrate 400 that may be utilized to form memory cell structures in the film stack 401.

As shown in the exemplary embodiment depicted in FIG. 4A, the substrate 400 may have a substantially planar surface, an uneven surface, or a substantially planar surface having a structure formed thereon. The film stack 401 is formed on the substrate 400. In one embodiment, the film stack 401 may be utilized to form a gate structure, a channel structure, a contact structure or an interconnection structure in the front end or back end processes. The method 300 may be formed on the film stack 401 to form a channel structure therein used in a memory cell structures, such as Vertical NAND structures. In one embodiment, the substrate 400 may be a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire. The substrate 400 may have various dimensions, such as 200 mm, 300 mm, 450 mm or other diameter wafers, as well as, rectangular or square panels. Unless otherwise noted, embodiments and examples described herein are conducted on substrates with a 200 mm diameter, a 300 mm diameter, a 450 mm diameter substrate. In the embodiment wherein a SOI structure is utilized for the substrate 400, the substrate 400 may include a buried dielectric layer disposed on a silicon crystalline substrate. In the embodiment depicted herein, the substrate 400 may be a crystalline silicon substrate.

In one embodiment, the film stack 401 disposed on the substrate 400 may have the film stack 401 that has a number of vertically stacked layers. The film stack 401 may comprise pairs including a first layer 402 (shown from $402a_1$ to $402a_n$) and a second layer 404 (shown from $404a_1$ to $404a_n$) repeatedly formed in the film stack 401. The pairs include alternating first layer 402 and second layer 404 repeatedly formed until desired numbers (e.g., the number may be n when n layers are formed) of pairs of the first layers and the second layers are reached.

The film stack 401, as depicted in FIG. 4A, is a part of a memory cell device, such as a three-dimensional (3D) memory device. It is noted that any desired number of repeating pairs of the first and second layers 402, 404 may be utilized as needed.

In one embodiment, the film stack 401 may be utilized to form multiple gate structures for a three-dimensional (3D) memory device. The first layers 402 formed in the film stack 401 a metal containing layer. Suitable dielectric layers may be utilized to form the first layers 402 include silicon oxide, silicon nitride, silicon oxynitride, silicon carbide, silicon oxycarbide, titanium nitride, composite of oxide and nitride, at least one or more oxide layers sandwiching a nitride layer, and combinations thereof, among others. Suitable metal containing layers may be utilized to form the second layers 404 comprise tungsten, iron, cobalt, ruthenium, platinum, copper, aluminum and the like.

It is believed that the metal containing layers in the film stack 401 may efficiently improve the electrical performance, such as electrical conductivity, and mobility, and the like, in the film stack 401 when later utilized as a gate structure in NAND or VNAND three dimensional semiconductor memory devices. In one particular example, the first layers 402 are silicon nitride or silicon oxide layers while the second layers 404 are tungsten or cobalt layers. In one embodiment, the thickness of first layers 402 may be controlled at between about 50 Å and about 1000 Å, such as about 500 Å, and the thickness of the each second layers 604b may be controlled at between about 50 Å and about 1000 Å, such as about 500 Å. The total thickness of the film stack 401 is about 3 microns to 10 microns and will vary as the technology advances.

The film stack 401 of the first layers 402 of silicon oxide layers and the second layers 404 of tungsten layers are formed on the substrate 400. The film stack 401 is later patterned to form a channel structure therein. A hardmask layer may be formed on the film stack 401 to facilitate forming openings (e.g., or called trenches, vias, apertures, or holes) in the film stack 401. The openings may be utilized to form as channels in the device structure when the manufacturing process is done. It is noted that the device structures and configurations may be varied as needed for different device performance requirements.

Figure 4B:
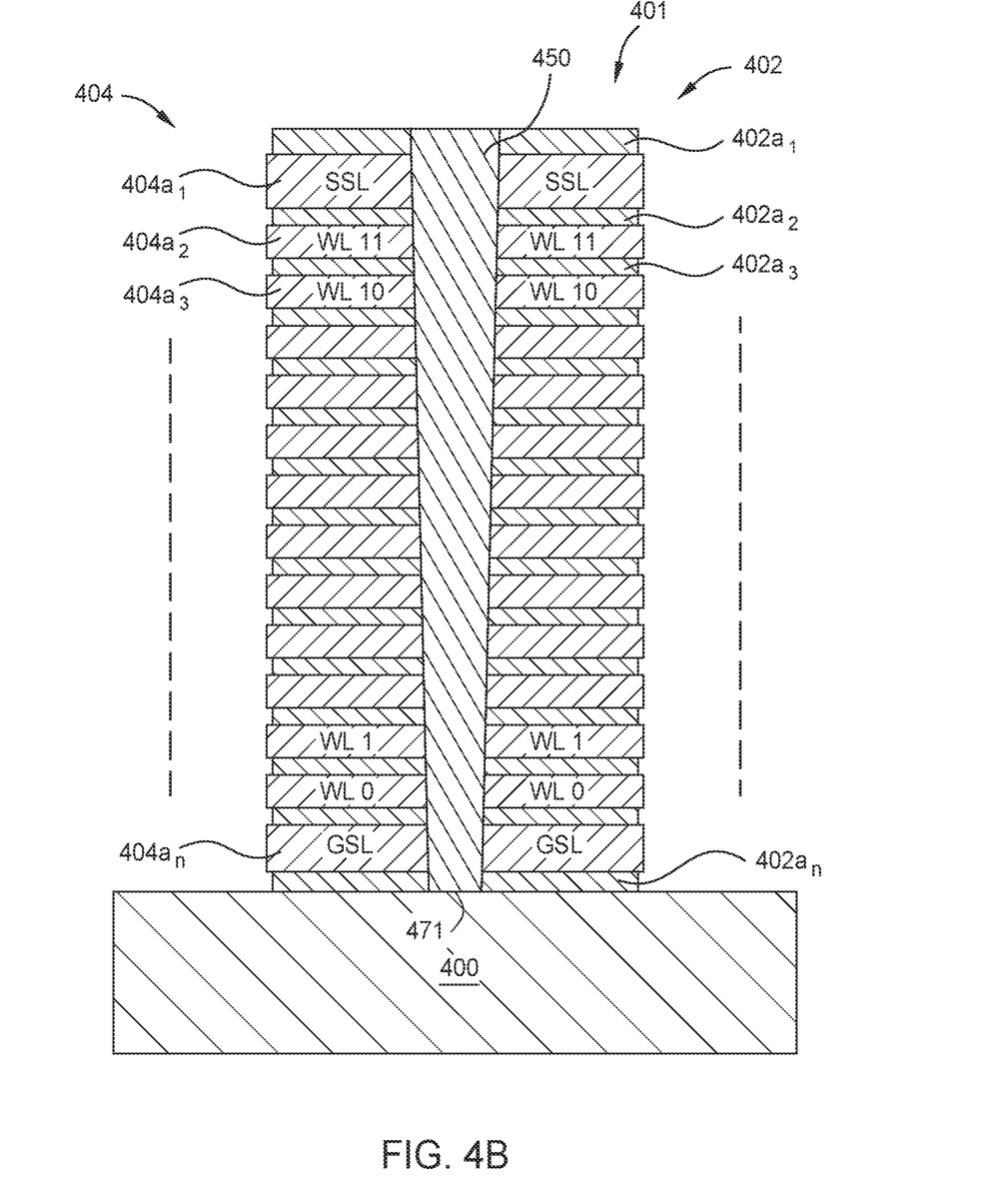

At operation 320, a patterning process is performed to form an opening 450 in the film stack 401, which will be later utilized as a channel structure, as shown in FIG. 4B. The patterning process may be any suitable patterning gas mixtures that may be utilized to etch the first and the second layers 402, 404 in the film stack 402. In one embodiment, the opening 450 is formed through the film stack 401 until a bottom surface 471 of the substrate 400 is exposed.

Figure 4C:
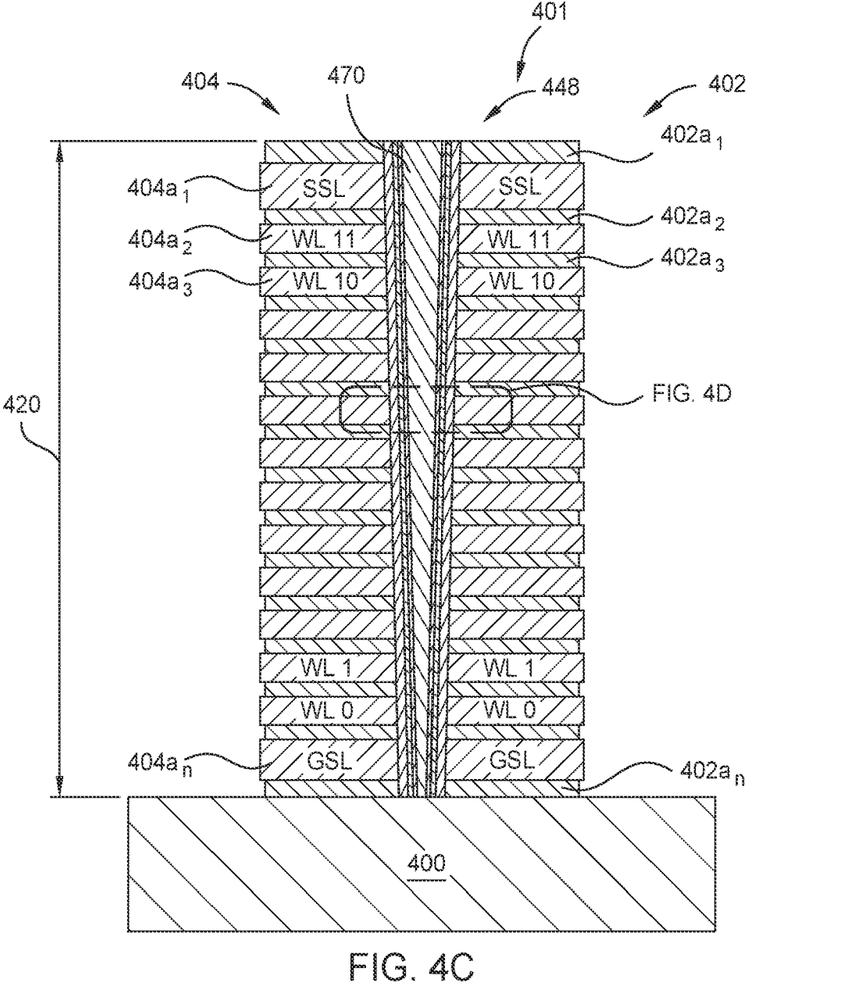
Figure 4D:
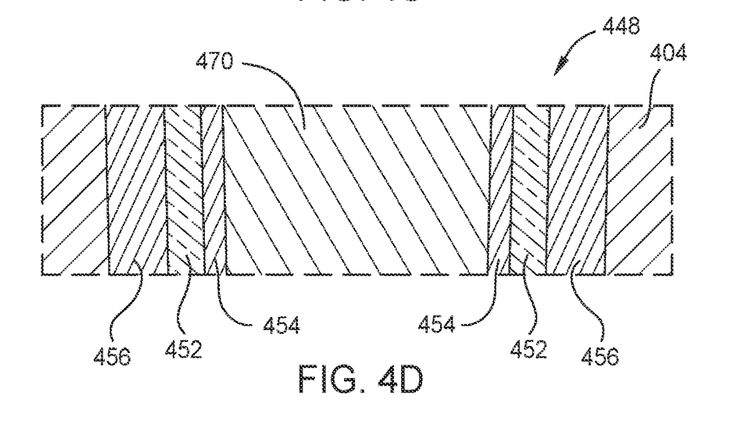

At operation 330, a protective oxide layer 456 is formed along a sidewall of the opening 450, as shown in FIG. 4C-4D. Additionally layers, such as additional dielectric layers 452, 454, may be formed on the protective blocking layer 456, as shown in the magnified view in FIG. 4D, as indicated by the dotted rectangular.

Subsequently, at operation 340 a channel layer 470 is formed and filled in the opening 450. The channel layer 470 may be formed by a CVD process, ALD process, sputtering process, coating process, or other suitable processes. In one example, the channel layer 470 is formed from a CVD process. In one example, the channel layer 470 may be fabricated from poly-Si, epitaxial silicon, oxide core material with silicon material or other semiconducting materials, such as IGZO, group III-V material or gallium oxide.

In one embodiment, the opening 450 formed in the film stack 401 may have a sloped sidewall (e.g., non-perpendicular or angled relative to the horizontal surface of the substrate 400) during the patterning and etching process. In some examples, the opening 450 often has a wider dimension at the top portion while has a relatively narrower dimension at the bottom portion as the reactive species from the etching process are often difficult to travel down to the bottom of the opening 450. However, the non-uniform widths of the opening 450 often results in electrical performance issues (e.g., the threshold voltage, cell current or the like) unpredictable, non-uniform and/or drift along the vertical length (e.g., depth 420) of the opening 450.

Accordingly, the channel layer 470 as filled in the opening 450 in the present disclosure is configured to have different film properties along its vertical length (e.g., depth 420). For example, a bottom portion 504 of the channel layer 470 filled in the opening 450 may have different film properties from the top portion 502 of the channel layer 470, as shown in the magnified views in FIGS. 5A-5B. The top portion 502 of the channel layer 470 may have different compositions of the elements, as compared to the compositions located at the bottom portion 504 of the channel layer 470. Thus, the channel layer 470 may be a gradient layer that has a gradually changed ratio of the compositions along the vertical length (e.g., depth 420) of the channel layer 470.

Figure 5A:
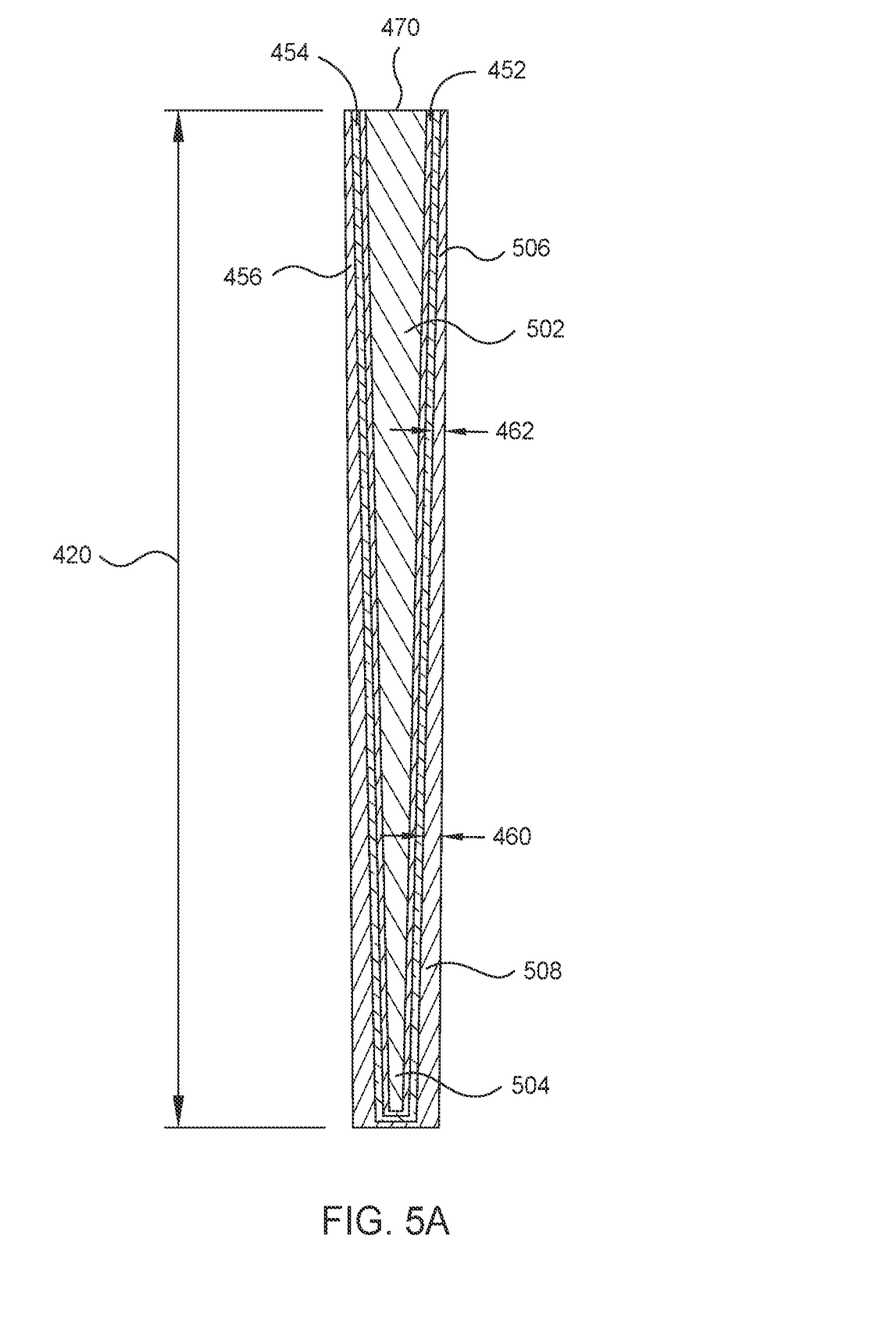
FIGS. 5A and 5B depict magnified views of a channel structure formed from the method of FIG. 3.
Figure 5B:
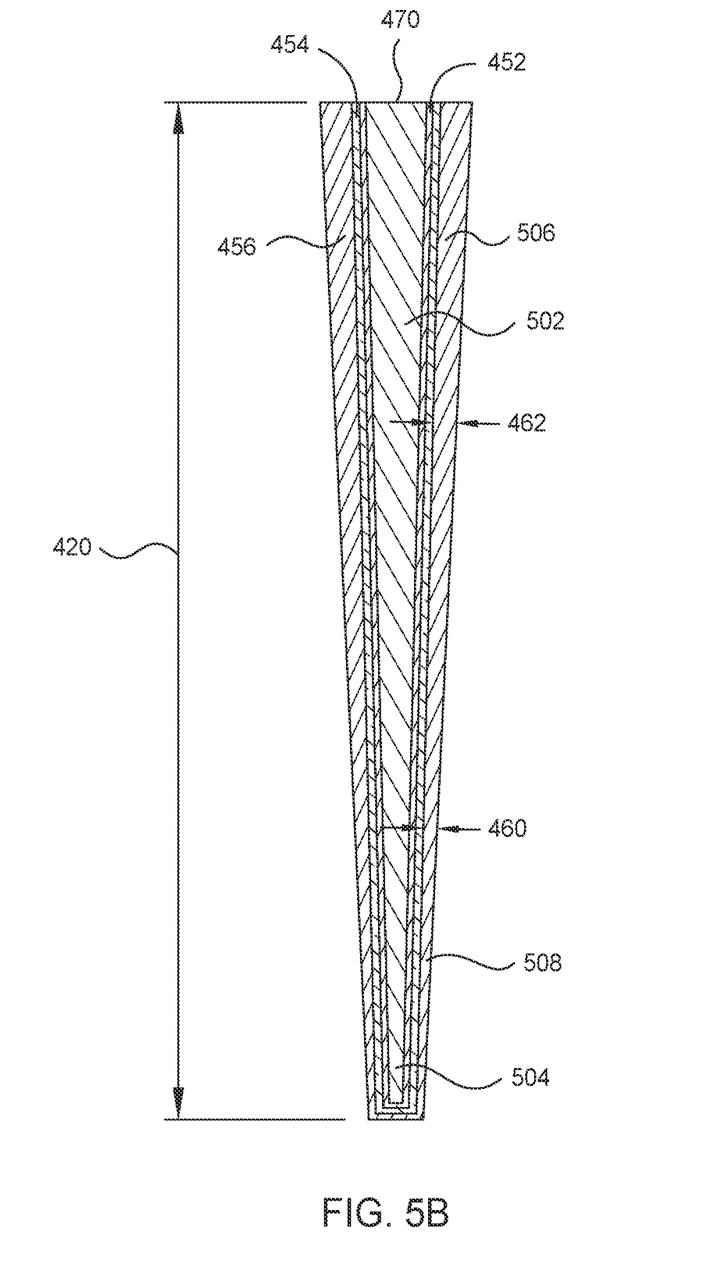

In one example wherein the channel layer 470 is formed from a CVD process, the ratio of the different gases supplied for depositing the channel layer 470 may be altered, adjusted, or changed so that the film properties of the channel layer 470 may be changed, adjusted or gradient as needed as the channel layer 470 grows. It is noted that the top portion 502 refers to about between 70% and about 100% about the total length (e.g., depth 420) of the channel layer 470. The bottom portion 504 refers to about between 0% and about 30% about the total length (e.g., depth 420) of the channel layer 470.

In the example wherein the channel layer 470 is formed from a doped polysilicon layer, a dopant gas, such as a group III or group V containing gas, may be utilized in the deposition gas mixture along with a silicon containing gas. The flow ratio of the dopant gas relative to the silicon containing gas in the deposition gas mixture may be adjusted so that the dopant concentration in the channel layer 470 varies as the channel layer 470 grows. In one example, the dopant concentration of the bottom portion 504 of the channel layer 470 is configured to be higher than the dopant concentration of the top portion 502 of the channel layer 470, rending the channel layer 470 has a gradient dopant concentration as the channel layer 470 grows. As the bottom portion 504 of the channel layer 470 has a relatively narrower width (caused by the angled slop of the channel layer 470), a higher dopant concentration of the channel layer 470 in the bottom portion 504 may be utilized to enhance the electrical performance. In contrast, as the top portion 502 of the channel layer 470 has a relatively wider width, a lower dopant concentration of the channel layer 470 in the top portion 502 may be utilized to balance the electrical performance, as compared to the bottom portion 504, providing an uniform electrical performance along the vertical length (e.g., depth 420) of the channel layer 470. In one example, the dopant concentration located at the bottom portion 504 may be between about 50% and about 400% greater than the dopant concentration located at the top portion 502 of the channel layer 470. In one example, the dopant concentration located at the bottom portion 504 may be about two to four orders of magnitude greater than the dopant concentration located at the top portion 502 of the channel layer 470. The dopant concentration at the bottom portion 504 may be in a range between about $5E17$ $cm^{-3}$ and about $5E18$ $cm^{-3}$ while the dopant concentration at the top portion 502 is at a range between about $5E14$ $cm^{-3}$ and about $5E15$ $cm^{-3}$.

In another embodiment, the channel layer 470 may initially be formed as a polysilicon layer from a CVD or ALD process. Subsequently, an ion implantation process may be performed to implant or dope dopants into the polysilicon layer, rendering a doped polysilicon layer with different dopant concentration at different locations of the channel layer 470. In one example, dopant gases selected to be doped into the polysilicon layer during the ion implantation process include a group III or group V gas. Suitable examples of the dopant gases include boron containing gas, such as $BH_3$, $B_2H_6$, $BF_3$, $BCl_3$ and the like, or a phosphorus containing gas, such as $PH_3$ and the like, and an arsenic containing gas, such as $AsH_3$, $AsF_5$ and the like. In one particular embodiment, channel layer 470 is a boron doped or phosphorus doped polysilicon layer.

Furthermore, in order to compensate the non-uniform electrical performance caused from the angled slope of the channel layer 470, the thickness of the protective blocking layer 456 formed along the sidewall of the opening 450 may also be adjusted, altered or varied as needed. In the examples depicted in FIGS. 5A-5B, a thickness 460 of the protective blocking layer 456 at its bottom portion 508 may be different from a thickness 462 of the protective blocking layer 456 at its top portion 506. In one example, the thickness of the protective blocking layer 456 may be gradually increased or decreased along the vertical length (e.g., depth 420) of the protective blocking layer 456. The gradually increased or decreased thickness of the protective blocking layer 456 may be obtained by altering or changing the gas ratio during deposition of the protective blocking layer 456. Alternatively, the protective blocking layer 456 may be initially formed as an uniform thickness across the protective blocking layer 456 (along the vertical depth of the protective blocking layer 456) and subsequently followed by an etching process to slightly etch a portion of the protective blocking layer 456 away so as to render the protective blocking layer 456 with different thickness at different locations of the protective blocking layer 456. In one embodiment shown in FIG. 5A, the bottom portion 508 of the protective blocking layer 456 may have the width 460 greater than the width 462 located at the top portion 506 of the protective blocking layer 456. In one example, the width 460 at the bottom portion 508 of the protective blocking layer 456 is between about 5% and about 80%, such as between about 20% and about 60%, greater than the width 462 located at the top portion 506 of the protective blocking layer 456.

In contrast, the bottom portion 508 of the protective blocking layer 456 may have the width 460 less than the width 462 located at the top portion 506 of the protective blocking layer 456, as shown in FIG. 5B. In one example, the width 460 at the bottom portion 508 of the protective blocking layer 456 is between about 5% and about 80% less than the width 462 located at the top portion 506 of the protective blocking layer 456. It is noted that the top portion 506 refers to about between 70% and about 100% about the total length (e.g., depth 420) of the protective blocking layer 456. The bottom portion 508 refers to about between 0% and about 30% about the total length (e.g., depth 420) of the protective blocking layer 456. The width 460 at the bottom portion 508 of the protective blocking layer 456 is between about 10 nm and about 40 nm, such as about 25 nm, and the width 462 at the top portion 506 of the protective blocking layer 456 is between about 8 nm and about 15 nm.

In one example, the protective blocking layer 456 may be an insulating material formed by suitable deposition techniques, such as a CVD process, ALD process, sputtering process, coating process, or other suitable processes. In one example, the protective blocking layer 456 is formed from a CVD process or an ALD process. Suitable examples of the insulating material for the protective blocking layer 456 includes $SiO_2$, SiON, SiCON, SiN, SiC, SiOC, amorphous carbon, or the like. In one particular example, the protective blocking layer 456 is $SiO_2$.

At operation 350, after the film layers are formed in the opening 450, a channel structure 448 is formed and completed in the film stack 401, as shown in FIGS. 4C and 4D. In the example depicted in FIGS. 4C-4D, in addition to the protective blocking layer 456, additional dielectric layers 452, 454 may be formed prior to forming the channel layer 470. The first dielectric layer 452 formed on the protective blocking layer 456 is a silicon nitride layer and the second dielectric layer 454 formed on the first dielectric layer 452 is a silicon oxide layer. It is noted that the materials for the first and the second dielectric layers 452, 454 may be any suitable materials that have insulating characteristics. In one example, the protective blocking layer 456, the first dielectric layer 452 and the second dielectric layer 454 in combination form an ONO structure (e.g., oxide-nitride-oxide) that provides a desired protective and blocking performance so as to ensure and confine the electric current in the channel layer 470 without adverse current leakage to the nearby structures.

In one embodiment, the first dielectric layer 452 and the second dielectric layer 454 generally has a uniform thickness with a range between about 2 nm and about 20 nm, such as about 4 nm.

Thus, methods and apparatus for forming a channel structure for manufacturing three dimensional (3D) stacking of memory cells of semiconductor devices are provided. A protective blocking layer at the interface between a channel layer and a film stack may have different thickness along its depth of the protective blocking layer. The protective blocking layer may protect the interface in contact with the channel layer and the film stack, thus providing a good control of the interface profile and topography as well as the desired electric performance. Furthermore, the channel layer formed in the film stack may have different ratios of the elements along the depth of the channel layer may also assist enhancing the electric performance, drift, or variation sourced from the sloped opening where the channel layer is formed therein. As a result, the protective blocking layer and/or the gradient channel layer provide a good electrical contact at the interface, thus providing a desired electrical performance to the memory cells.

While the foregoing is directed to embodiments of the present disclosure, other and further embodiments of the disclosure may be devised without departing from the basic scope thereof, and the scope thereof is determined by the claims that follow.

The invention claimed is:

1. A memory cell device, comprising:
    a film stack comprising alternating pairs of dielectric layers and conductive structures horizontally formed on a substrate; and
    a channel structure formed in the film stack, the channel structure comprising:
        a channel layer comprising a semiconductor material, the channel layer having a gradient dopant concentration and a gradual change in thickness along a vertical stacking of the film stack;
        a first dielectric layer in contact with the channel layer, the first dielectric layer comprising an oxide;
        a second dielectric layer in contact with the first dielectric layer, the second dielectric layer comprising a nitride; and
        a protective blocking layer formed on the substrate and disposed between the film stack and the second dielectric layer, the protective blocking layer comprising an oxide and having a first thickness at a bottom portion of the protective blocking layer less than a second thickness at a top portion of the protective blocking layer, wherein the first dielectric layer, the second dielectric layer, and the protective blocking layer extend around a bottom portion of the channel layer from a first sidewall of the channel layer to a second sidewall of the channel layer.

2. The memory cell device of claim 1, wherein the first thickness is between about 5% and about 80% less than the second thickness.

3. The memory cell device of claim 1, wherein the channel layer has a first dopant concentration at a bottom portion of the channel layer greater than a second dopant concentration at a top portion of the channel layer.

4. The memory cell device of claim 3, wherein the first dopant concentration is between about 200% and about 400% greater than the second dopant concentration.

5. The memory cell device of claim 1, wherein the channel layer is a doped silicon containing layer, group III-V material, IGZO or gallium oxide material.

6. The memory cell device of claim 1, wherein the protective blocking layer is a dielectric layer.

7. The memory cell device of claim 1, wherein the channel layer is a doped polysilicon layer and the protective blocking layer is at least one of $SiO_2$, SiON, SiCON, or SiOC.

* * * * *